(12) United States Patent
Thiruvengadam et al.

(10) Patent No.: US 12,513,839 B2
(45) Date of Patent: Dec. 30, 2025

(54) CONNECTION ASSEMBLY BETWEEN TWO HOUSING CHAMBERS OF A CONTROLLER

(71) Applicant: ZF Friedrichshafen AG, Friedrichshafen (DE)

(72) Inventors: Ajay Srinivas Thiruvengadam, Friedrichshafen (DE); Markus Ulbricht, Tettnang (DE); Daniel Pfeiffer, Berg (DE); Henrik Schuh, Friedrichshafen (DE); Michael Schwab, Markdorf (DE); Julian Burkhart, Vogt (DE); Tobias Nusser, Meckenbeuren (DE); Florian Finkenzeller, Barnstorf (DE); Gerhard Höring, Hagnau am Bodensee (DE)

(73) Assignee: ZF Friedrichshafen Ag, Friedrichshafen (DE)

( * ) Notice: Subject to any disclaimer, the term of this patent is extended or adjusted under 35 U.S.C. 154(b) by 0 days.

(21) Appl. No.: 18/597,109

(22) Filed: Mar. 6, 2024

(65) Prior Publication Data

US 2024/0324129 A1    Sep. 26, 2024

(30) Foreign Application Priority Data

Mar. 8, 2023    (DE) ...................... 10 2023 202 054.8

(51) Int. Cl.
*H05K 5/02*    (2006.01)
*H05K 5/06*    (2006.01)

(52) U.S. Cl.
CPC ........... *H05K 5/0247* (2013.01); *H05K 5/062* (2013.01)

(58) Field of Classification Search
CPC .................................................... H05K 5/0247
See application file for complete search history.

(56) References Cited

U.S. PATENT DOCUMENTS

| | | | |
|---|---|---|---|
| 5,109,458 A | 4/1992 | Dixit et al. | |
| 5,253,143 A | 10/1993 | Klinger et al. | |
| 6,239,370 B1 * | 5/2001 | Loibl | H05K 1/118 174/650 |

(Continued)

FOREIGN PATENT DOCUMENTS

| | | |
|---|---|---|
| DE | 10 2013 215 227 A1 | 2/2015 |
| DE | 101 15 693 A1 | 10/2022 |

OTHER PUBLICATIONS

German Patent Office, German Search Report issued in German patent application No. 10 2023 202 054.8 (Mar. 7, 2024).

*Primary Examiner* — Hung V Ngo
(74) *Attorney, Agent, or Firm* — Finch & Maloney PLLC (57) ABSTRACT

A connection assembly (11, 11a) between two housing chambers (1, 2) of a control unit, includes a housing having at least two housing chambers (1, 2) and a housing partition wall (3) for separating the two housing chambers (1, 2) and defines a break-through (7). The first housing chamber (1) is configured as a dry chamber and comprises at least one first contact partner. The second housing chamber (2) is configured as a wet chamber and comprises at least one second contact partner. An electrical line (5) electrically connects at least the first contact partner to the second contact partner. The electrical line (5) is guided through the break-through (7) and includes, locally in the region of the break-through (7), a single-layer or multi-layer sheathing (8) for sealing the break-through (7). An electronics module utilizing the connection assembly is also disclosed.

12 Claims, 6 Drawing Sheets

(56) References Cited

U.S. PATENT DOCUMENTS

2014/0182928 A1* 7/2014 Starke .................. H02G 15/117
                                                    174/152 G
2016/0099557 A1* 4/2016 Volkl ................... H02G 15/003
                                                    174/521

* cited by examiner

CONNECTION ASSEMBLY BETWEEN TWO HOUSING CHAMBERS OF A CONTROLLER

RELATED APPLICATIONS

This application claims the benefit of and right of priority under 35 U.S.C. § 119 to German Patent Application no. 10 2023 202 054.8, filed on 8 Mar. 2023, the contents of which are incorporated herein by reference in its entirety.

FIELD OF THE DISCLOSURE

The invention relates to a connection assembly between two housing chambers of a control unit, comprising a housing having at least two housing chambers and a housing partition wall, which separates the first and second housing chambers from one another. The first housing chamber is configured as a dry chamber and comprises at least one first contact partner having at least one electrically conductive region. The second housing chamber is designed as a wet chamber and comprises at least one second contact partner having at least one second electrically conductive region.

BACKGROUND

In control units with a dry chamber comprising a circuit board and/or electrical components, the dry chamber must be protected against moisture penetration. At the same time, an electrical connection out of the dry chamber must be established. So-called flexible films can be used as electrical lines for this purpose.

Today, flex films are a widely used element for electrical contacting of components. Generally, the electrical contact between flex films and their counterparts is brought about by soft soldering, bonding, laser welding, and the like. A flex film can comprise one or more conductor tracks. In addition, flex films can have bonding surfaces in order to establish at least one electrical connection to an electronic unit.

In order to establish an electrical connection between a wet chamber and a dry chamber of a control unit, the cable routing from the wet chamber to the dry chamber must be sealed. In a known application, such a sealing has been carried out by a separate, circumferential sealing frame, which seals the wet chamber against moisture and enables electrical contacting by containing a cable routing. However, such a sealing frame is very cost-intensive.

DE 101 15 693 A1 discloses a seal for a cable routing through a carrier plate of a motor vehicle door, wherein the cable routing is closed by a molding. In this case, a gel-like compound is arranged between a film conductor, a flexible circuit board, or the like and the molding and/or carrier plate for sealing intermediate chambers.

DE 10 2013 215 227 A1 discloses an electronics module, in particular for a transmission control in a motor vehicle. The electronics module comprises: a circuit board, a module base plate, a sealing ring, and a flex film, wherein the circuit board is designed as a circuit carrier for a control circuit and comprises several electronic components of the control circuit on its bottom side. Electronic components are electrically contacted through the circuit board to terminal pads on a top side of the circuit board. The circuit board, the module base plate, and the sealing ring jointly enclose a central cavity in which the electronic components of the control circuit are accommodated. The flex film comprises electrical terminals and electrical conductor tracks connected to these terminals, wherein the flex film is arranged on the top side of the circuit board and the terminal pads of the circuit board are electrically connected to the electrical terminals of the flex film.

SUMMARY

A problem addressed by the invention is to provide an improved connection assembly as well as an electronics module, which enables a simplified laying of electrical connections and improves the tightness at the interface between a wet chamber and a dry chamber.

The problem is solved by a connection assembly and by an electronics module as variously disclosed herein.

Further embodiments will be apparent from the detailed description and the figures, which can be combined with one another in a suitable manner in order to achieve further advantages.

The problem is solved by a connection assembly between two housing chambers of a control unit, in particular a vehicle control unit. The control unit can be configured as an electronics module, for example.

Accordingly, the connection assembly comprises a housing having at least two housing chambers and a housing partition wall, which separates the first and second housing chambers from one another. The first housing chamber is configured as a dry chamber, wherein the first housing chamber comprises at least one first electrical contact partner with in particular at least one electrically conductive region. The second housing chamber is configured as a wet chamber, wherein the second housing chamber comprises at least one second electrical contact partner with in particular at least one second electrically conductive region. A breakthrough, i.e., a suitable opening, is provided in the housing partition wall. An electrical line is also provided, which electrically connects at least the first electrical contact partner and the second electrical contact partner to one another. The electrical connection is in particular used for electrical transmission of information between the contact partners. The electrical line is guided through the breakthrough in order to connect the first contact partner to the second contact partner. In particular, it is threaded through the break-through.

In the region of the break-through, the electrical line comprises a single-layer or multi-layer sheathing in order to seal the break-through. The sheathing thus serves alone or in conjunction with further sealing measures in order to seal the break-through, so that no undesirable transfer of media from the wet chamber into the dry chamber takes place. The sheathing in particular forms a local thickening of the electrical line in the region of the break-through.

The break-through is configured in such a way that it is possible to pass the electrical line through it.

In particular, the single or multi-layer sheathing is provided only (exclusively) in the region of the break-through.

The dry chamber is in particular a media-tight chamber, in which sensitive electronics are preferably arranged. These electronics in particular represent the first contact partner. Accordingly, the dry chamber is in particular sealed against moisture and/or oil. For example, the first contact partner can be configured as a circuit board or a printed circuit. For contacting the first contact partner, the electrical line can correspondingly comprise suitable terminals or contact regions.

A wet chamber can, for example, be an oil-wet chamber or an open chamber or a chamber that is not sealed in a media-tight manner. The second contact partner can, for example, be configured as an electrical terminal, such as a terminal plug. To contact the second contact partner, the electrical line can correspondingly comprise suitable terminals or contact regions.

With the sheathing, a media-tight seal of the break-through can be achieved in a simple manner. At the same time, a disassembly can be made possible without destroying components, such as the housing in particular. A correction can also be made when assembling the electrical line in the housing. Likewise, an elasticity of the electrical line can be maintained because it is only encased by the sheathing in the region of the break-through. With the sheathing, a particularly uniform contact pressure and thus a particularly high sealing effect on the break-through can also be achieved. Furthermore, production thereof can be easily realized, because such a sheathing outside the housing can be easily produced in a serial fashion. The sheathing can be cost-effective. The sheathing is in particular formed by a local overmolding of the electrical line. In particular, cost-intensive vulcanization of the sheathing is omitted. A particularly cost-effective sealing between the wet chamber and the dry chamber is thus possible.

The electrical line is in particular flexibly configured. The electrical line is preferably configured as a flexible circuit board or as a flexible film. Due to its flexibility and low height, it is particularly well suited as such an electrical line. In particular, the electrical line has a plurality of electrically conductive strands in order to electrically connect one or more such first electrical contact partners to one or more such second electrical contact partners. It can be provided that a plurality of such electrical lines, in particular a plurality of flexible circuit boards or flex films, are provided for the electrical connection between the first and second housing chamber, which are in particular surrounded by the single-layer or multi-layer sheathing next to one another in the region of the break-through.

The electrical line in particular comprises an electrical insulation. It extends in particular over the length of the electrical line. The sheathing is then applied onto the electrical insulation.

In a further embodiment, a sealing ring is provided, which is arranged between the sheathing and the break-through and thus causes a sealing effect between the break-through and the sheathing. Such a sealing ring can be configured in particular as an O-ring. This sealing ring enhances the sealing effect of the sheathing.

In a further embodiment, the sheathing comprises a circumferential groove, wherein the sealing ring is arranged in the circumferential groove. As a result, the sealing ring can be arranged at a fixed location in the sheathing, as well as aligned precisely with the height of the break-through.

In a further embodiment, the sheathed region of the electrical line, i.e. the sheathing, comprises a start and an end, wherein the start is formed in the insertion direction. The insertion direction specifies the direction in which the electrical line is threaded through the break-through. The sheathed region comprises a stop element at the start or shortly after the start. In this case, the stop element abuts the housing partition wall in the insertion direction.

The insertion direction thus specifies the direction in which the electrical line is threaded through the break-through in order to establish the electrical connection between the first and second electrical contact partner in the respective chamber. Such a stop element ensures that the sheathing is securely arranged in the break-through during assembly and that the electrical line is not threaded too far or too little through the break-through. Such a stop element can also encase a smaller region of the electrical line, because the stop element ensures that this region is arranged in the break-through. As a result, the region to be sheathed can also be kept as small as possible, which also contributes to the cost reduction and flexibility of the electrical line.

In a further embodiment, a fixing element is provided, such as in particular a retaining bracket or a snap hook, which is arranged in the insertion direction in front of the actual stop element, so that the stop element is fixed onto the housing partition wall. The fixing element can be configured so as to cause a pressing of the stop element against the housing partition wall. The sealing effect can thus be improved. The fixing element can be attached to the stop element or arranged thereon. It is also possible that the stop element and the fixing element are formed integrally with one another. The sheathing is secured by the fixing element against falling out or slipping out.

In a further embodiment, one or more retaining elements for fastening the fixing element are provided on the housing partition wall. The retaining element(s) can, for example, be configured as a plug-in sleeve, latching groove, or floor anchor for the subsequent assembly and fastening of the fixing element. Alternatively, when using a snap hook as a fixing element, this snap hook can already be mounted and bent downward to the extent that a passage of the electrical line is subsequently possible.

In a further embodiment, the stop element and the sheathing are formed integrally. This makes it easy to mount them on the electrical line.

In a further embodiment, the sheathing comprises a plastic or consists of plastic. This makes a simple production of the sheathing possible, such as in particular by means of overmolding.

In a further embodiment, the sheathing is made of plastic such that a fixed connection to the electrical line is established. The fixed connection can be carried out, for example, by means of a material connection, a form-fit connection, and/or a force-fit connection. By using a plastic for the sheathing with a low first degree of hardness, a very good connection of the electrical line to the sheathing is possible here.

In a further embodiment, the sheathing comprises or consists of a plastic having a first degree of hardness, and an injection-molded attachment is provided, wherein the injection-molded attachment comprises or consists of a (different) plastic having a second degree of hardness. The second degree of hardness is higher than the first degree of hardness. The injection-molded attachment is injection molded at least partially onto the sheathing such that the injection-molded attachment is permanently connected to the sheathing and at least partially abuts the break-through.

Such a double sheathing can prevent the softer (internal) sheathing from flowing away in case of continuous stress. A particularly firm connection can also be achieved, because the harder (outer) plastic usually has a good fixation on the softer (inner) plastic, but not directly on the electrical line. In this way, a very stress-resistant sealing of the electrical line in the break-through can be achieved.

In a further embodiment, the sheathed region of the electrical line, i.e., the sheathing, can have a start and an end, wherein the start is formed in the insertion direction. As already explained above, the insertion direction specifies the direction in which the electrical line is threaded through the break-through. The injection-molded attachment can now comprise a stop or the stop element in the region of the start. This stop element can thus abut the housing partition wall in the insertion direction. The injection-molded attachment and the stop element can be formed integrally.

Furthermore, the sheathing can be applied as a pre-overmolding by means of low-pressure injection molding and the injection-molded attachment can be applied as a post-overmolding by means of high-pressure injection molding. A second, higher degree of hardness for the injection-molded attachment and a first, lower degree of hardness for the sheathing can thus simply be realized. This also simplifies the application of the sheathing and the injection-molded attachment on the electrical line.

The sheathing is in particular formed from a melt adhesive. The injection-molded attachment is in particular formed from a thermoplastic. However, other easy-to-process, cost-effective, or otherwise suitable plastics can also be used for this purpose.

In a further embodiment, the sealing ring is arranged between the injection-molded attachment and the break-through and causes a sealing effect between the break-through and the injection-molded attachment. By attaching the sealing ring in the plastic with the second, higher degree of hardness, a permanent positioning of the sealing ring between the break-through and the injection-molded attachment can be achieved. A loss of the sealing effect of the sealing ring due to the flow effect (flowing away) of softer plastic in case of continuous stress can thus be prevented.

In a further embodiment, the injection-molded attachment comprises a circumferential groove, wherein the sealing ring is arranged in the circumferential groove. As a result, the sealing ring can be arranged at a fixed location in the injection-molded attachment and can be precisely aligned with the height of the break-through.

In a further embodiment, the first contact partner is configured as a circuit board or a printed circuit. This first contact partner can be connected, for example, by means of the electrical line from the dry chamber to an electrical connection in the wet chamber (second contact partner), such as in particular a sensor terminal, an electrical component, or a plug connection.

The wet chamber can be contaminated with oil-rich air, for example, and must therefore be sealed against the dry chamber, i.e., against the circuit board or printed circuit contained therein. The housing and/or the housing partition wall can be designed as a cast wall.

The problem is further solved by an electronics module for a vehicle, comprising a connection assembly as described above. The electronics module in particular contains regions that are configured as plugs. The electronics module can form the control unit, and the electronics module can also be configured for a vehicle. The electronics module can therefore be a control unit of a vehicle drive assembly or an automatically shiftable vehicle transmission, for example.

BRIEF DESCRIPTION OF THE DRAWINGS

Further features and advantages of the invention arise from the following description with reference to the enclosed figures. The following are shown schematically.

DETAILED DESCRIPTION

Figure 1:
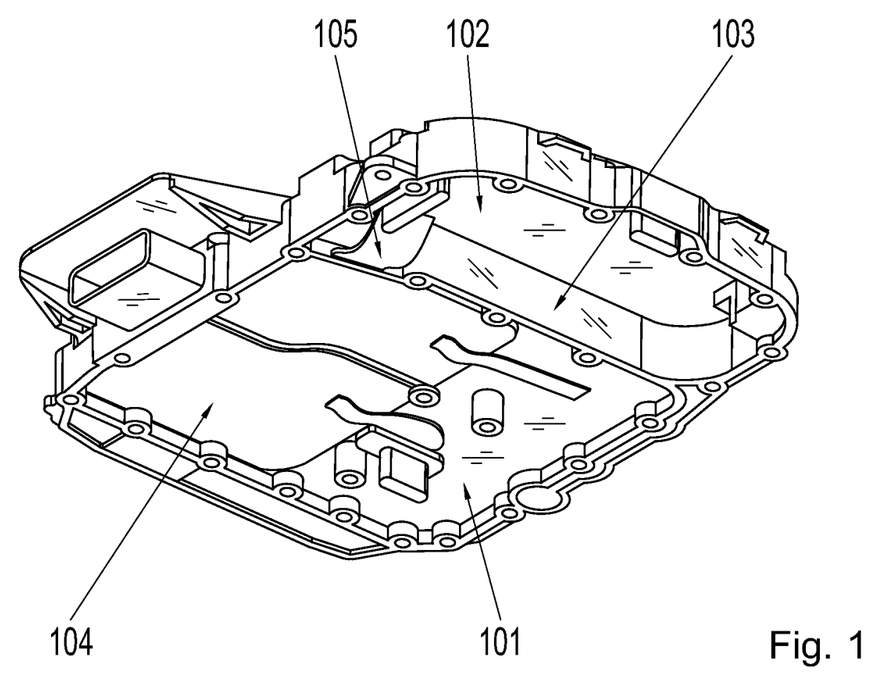
FIG. 1: a connection assembly according to the prior art.
Figure 2:
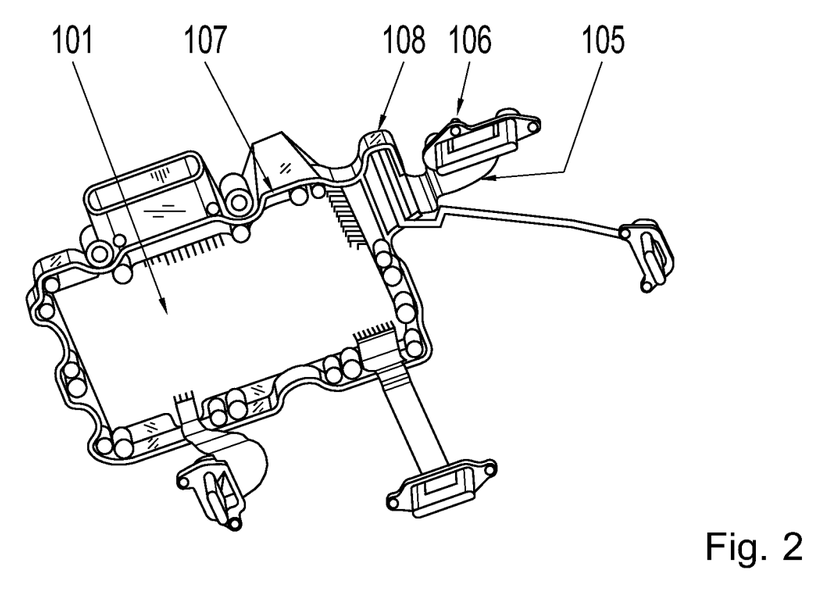
FIG. 2: a sealing of the connection assembly from FIG. 1,
FIG. 3: a connection assembly in a first embodiment.

FIG. 1 and FIG. 2 show a connection between two housing chambers 101, 102 according to the prior art in three-dimensional views, as used, for example, in a control unit of a vehicle transmission. The first housing chamber 101 is configured as a dry chamber, which comprises sensitive electronics, such as a circuit board or an ECU 104. The second housing chamber 102 is separated from the first housing chamber 101 by a housing partition wall 103. The second housing chamber 102 is configured as a wet chamber. The wet chamber 102 can a chamber that is not closed in a media-tight manner and can thus be contaminated with oil-wet air.

As an electrical connection between the first housing chamber 101 and the second housing chamber 102, a flex film 105 is provided, which, for example, electrically connects the circuit board or ECU 104 in the first housing chamber 101 to a sensor terminal 106 in the second housing chamber 102.

The sealing of the first housing chamber 101 and the line routing into the second housing chamber 102 is carried out via the circumferential sealing frame 107 visible in FIG. 2. On the sealing frame 107 in the region of the housing partition wall 103, a protrusion 108 is provided, on which the flex film 105 leads out of the dry chamber 101. The sealing frame 107 separates the first housing chamber 101 and the second housing chamber 102 from each other in a media-tight manner. However, such a circumferential, frame-like seal 107 is very cost-intensive.

Figure 3:
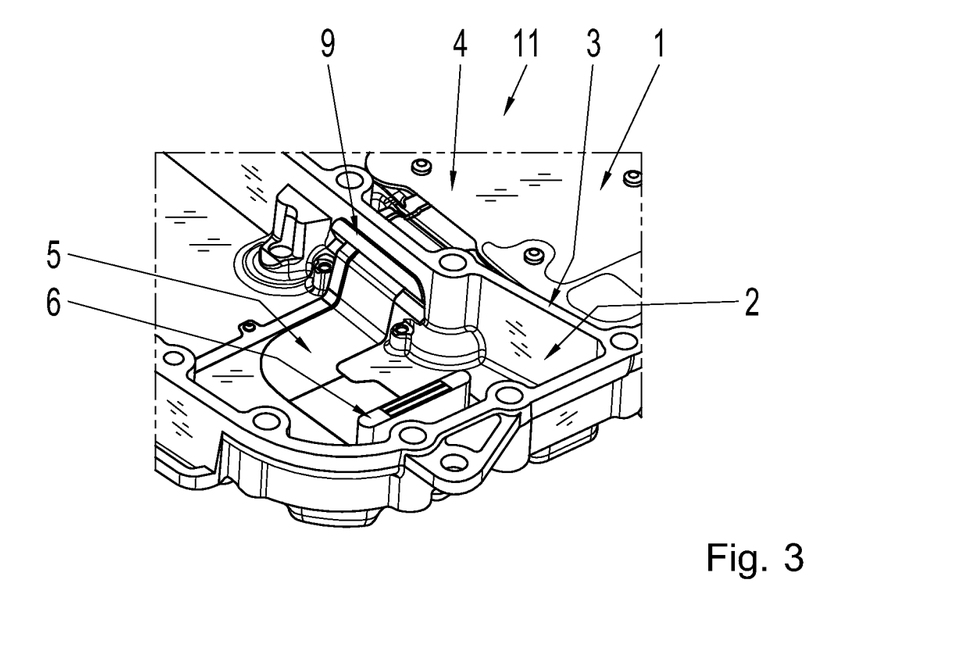
Figure 4:
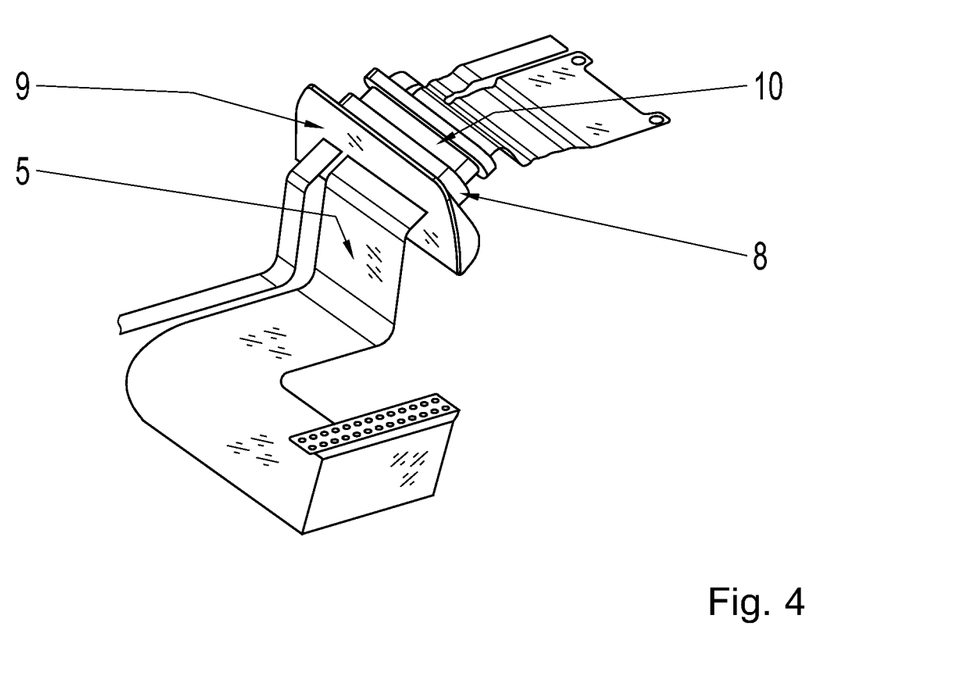
FIG. 4: parts of the connection assembly from FIG. 3,
FIG. 5: Parts of a further connection assembly having a groove and a sealing ring arranged therein.

FIG. 3 and FIG. 4 show three-dimensional views of a first embodiment of a proposed connection assembly 11. It serves for the media-tight electrical connection of a first housing chamber 1 and a second housing chamber 2 of a control unit. The housing chambers 1, 2 are accommodated in a housing of the control unit.

The first housing chamber 1 is configured as a dry chamber and the second housing chamber 2 is configured as a wet chamber. As the first electrical contact partner, the first housing chamber 1 in particular contains a circuit board 4, which can be equipped with a microcontroller, among other things. The second housing chamber 2 contains a second electrical contact partner, such as, in particular, at least one electrical terminal 6. The terminal 6 can be configured as a terminal plug for a sensor, for example.

A housing partition wall 3 is further provided, which separates the first housing chamber 1 and the second housing chamber 2 from one another. The walls of the individual housing chambers 1, 2 as well as the housing partition wall 3 can be configured as a casting.

An open top side of the control unit housing, which is visible in FIG. 3 and forms the housing chambers 1, 2, is closed in the typical manner, for example by a housing cover or in that the control unit housing is mounted with this top side onto a further, superordinate housing, such as a drive unit or a transmission. The bottom side of the control unit housing opposite the top side can already be formed closed by the wall of the housing.

Furthermore, an electrical line 5, configured for example as a flex film, is provided for electrically connecting the first electrical contact partner 6 and the second electrical contact partner 4. The electrical line 5 is in particular equipped with an electrical insulation material along its extension in the longitudinal direction, such as an insulating lacquer or a typical cable sheathing.

Furthermore, the connection assembly 11 according to the invention comprises a break-through, which runs through the housing partition wall 3. The electrical line 5 is threaded into it. The electrical line 5 comprises a local (additional) sheathing 8 in the region of the break-through. The sheathing 8 forms a local thickening and serves to seal the break-through in the housing partition wall 3, so that the media-tightness of the first housing chamber 1 is still given. The sheathing 8 is configured in particular as an overmolding of the electrical line 5.

In order to achieve a fixed connection of the sheathing 8 to the electrical line 5, this sheathing 8 can be made of a plastic having a suitable first and relatively low degree of hardness. Such a plastic can be a melt adhesive, for example. The plastic can furthermore be applied onto the line 5 by means of a low-pressure method.

The sheathing 8 is preferably tight against media, in particular against water, oil, and steam. The sheathing 8 in particular also has good plasticity and a good connection to the electrical line 5.

In order to keep the size of the sheathing 8 as small as possible and also to apply it in a targeted manner in the break-through, the sheathed region of the electrical line 5 comprises a stop element 9. This stop element 9 is arranged at the start of the sheathing 8, wherein the start is formed in an insertion direction D (see FIG. 6). The insertion direction D is the direction in which the electrical line 5 is threaded through the break-through during its assembly in the housing. A stop can thus be achieved by the stop element 9 when the sheathing 8 is in the correct end position in the break-through. This ensures that the sheathing 8 is securely arranged in the break-through, and the break-through is thus sealed.

By limiting the sheathing 8 to the region of the break-through, the flexibility of the electrical line 5 can be maintained and, at the same time, a sealing of this connection site of the housing chambers 1, 2 can be ensured.

Furthermore, a correction can be made during the assembly of the electrical line 5, and a simple disassembly can also be performed without the need to destroy the housing or the electrical line 5. The stop element 9 abuts directly against the housing partition wall 3. The stop element 9 and the sheathing 8 can be produced integrally, i.e., in one piece, for example jointly by means of a low-pressure method.

The sheathing 8 can further comprise a groove 10. The groove 10 is arranged centrally or opposite the stop element 9 in the sheathing 8.

FIG. 4 shows the groove 10 with the corresponding stop element 9, as well as the sheathing 8. The groove 10 is arranged circumferentially in the sheathing 8. A sealing ring, such as an O-ring, can be arranged in the groove 10 for sealing, see for example FIG. 5.

Figure 5:
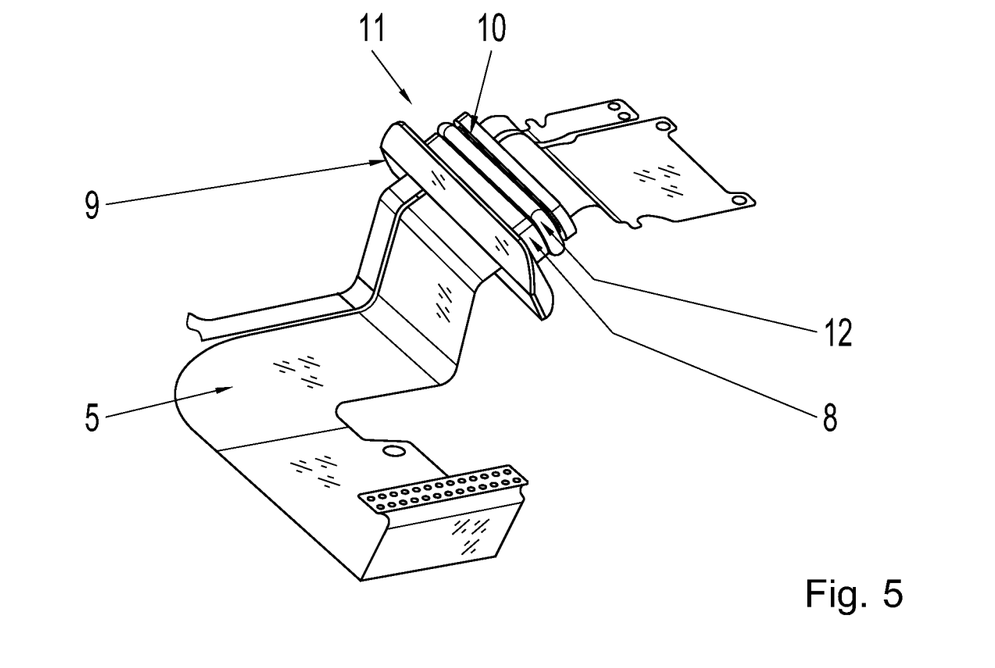

In a three-dimensional view, FIG. 5 shows parts of a further connection assembly, which, analogous to the design according to FIG. 3 and FIG. 4, comprises a groove 10 having a sealing ring 12 arranged therein, a stop element 9, and a sheathing 8. The sealing ring 12 can be fixed in the sheathing 8 by the groove 10, wherein the groove 10 as well as the sealing ring 12 are aligned with the height of the break-through. Due to the fact that, in the installed state, the sealing ring 12 is clamped between the sheathing 8 and the break-through, the sealing effect can be increased.

Figure 6:
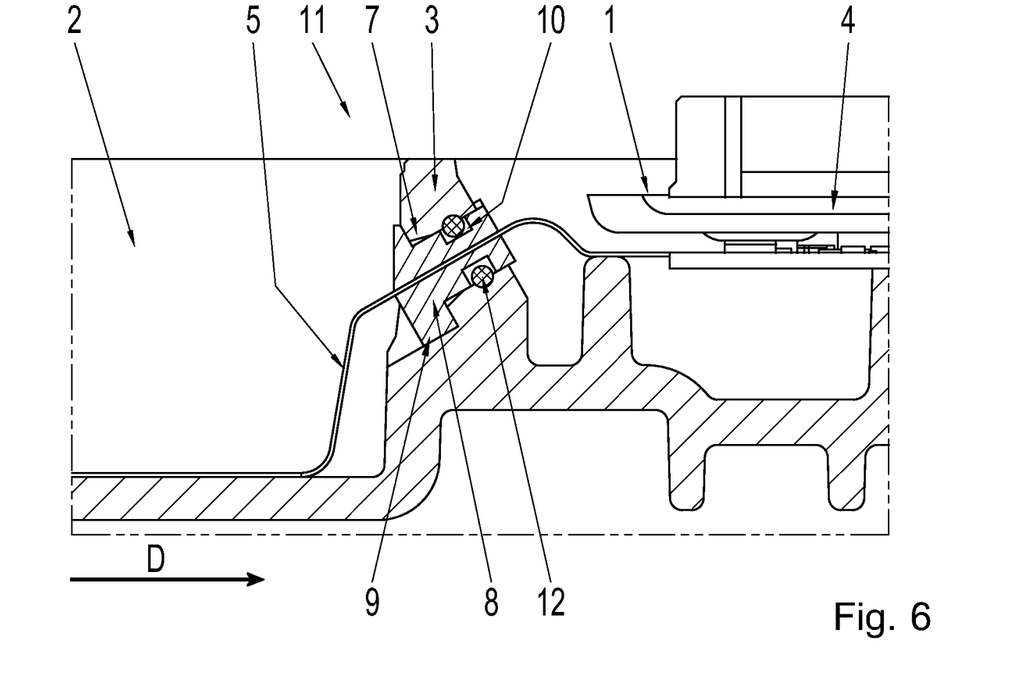
FIG. 6: a sectional view through the connection assembly according to FIG. 5,
FIG. 7: a connection assembly with a fixing element.

FIG. 6 shows a sectional view of parts of the connection assembly according to FIG. 5. The break-through 7 in the housing partition wall 3 is clearly visible here. The electrical line 5 is threaded into the break-through 7 in the direction of the first housing chamber 1 with the sheathing 8 as well as the groove 10 and the sealing ring 12 from the side of the second housing chamber 2. The reference numeral D indicates this insertion direction of the electrical line 5 through the break-through 7. The stop element 9 thus abuts the housing partition wall 3 on the side of the second housing chamber 2. The stop element 9 can be formed integrally with the sheathing 8.

In this way, a simple sealing of the break-through 7 can be ensured. This allows costs to be saved. Furthermore, a correction can be made during assembly as well as during disassembly without needing to destroy the housing and thus entire component as well as the electrical line 5.

A fixing element can be provided for secure fastening of the sheathing 8 in the break-through 7. Preferred embodiments for such fixing elements 13, 14 are visible in FIG. 7 through 10.

Figure 7:
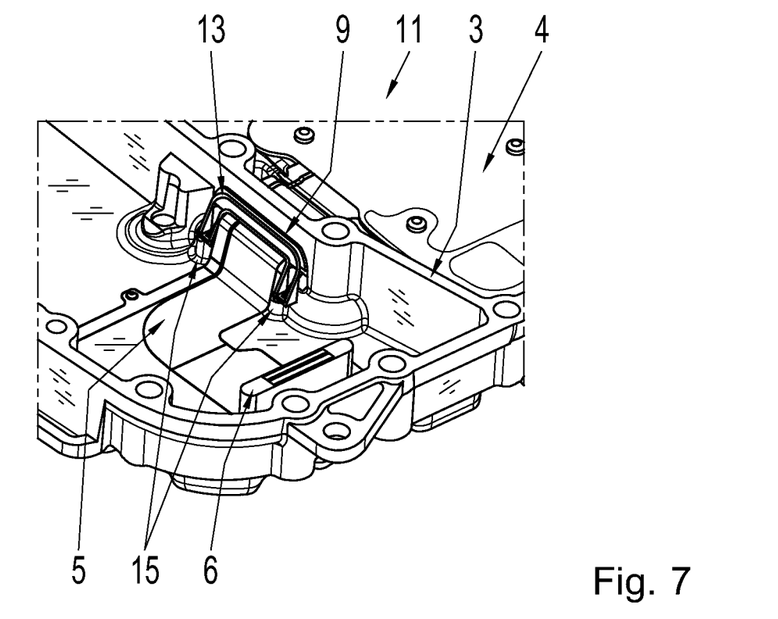

FIG. 7 shows a three-dimensional view of a further connection assembly having a fixing element 13 in the form of a retaining bracket 13. The connection assembly can otherwise correspond to that of FIG. 3. The fixing element 13 is in this case arranged in front of the stop element 9 in the insertion direction. The fixing element 13 causes a fixing and pressing of the stop element 9 onto the housing partition wall 3. Thus, the sheathing and the electrical line 5 are also fixed in the break-through in a slip-proof manner. This can increase the service life of the connection assembly, even in case of extreme or continuous stress.

The fixing element 13 can be made of plastic. It can then be produced directly together with the stop element 9 and/or the sheathing, or it can be subsequently molded onto it. Alternatively, the fixing element 13 can form a separate component, which is only mounted after threading of the electrical line 5 and insertion of the sheathing into the break-through.

To fasten the fixing element 13, the retaining elements 15, such as insertion sleeves or latching grooves, can be provided on the housing partition wall 3. These retaining elements 15 can thus be configured as a type of floor anchor for the fixing element 13.

Figure 8:
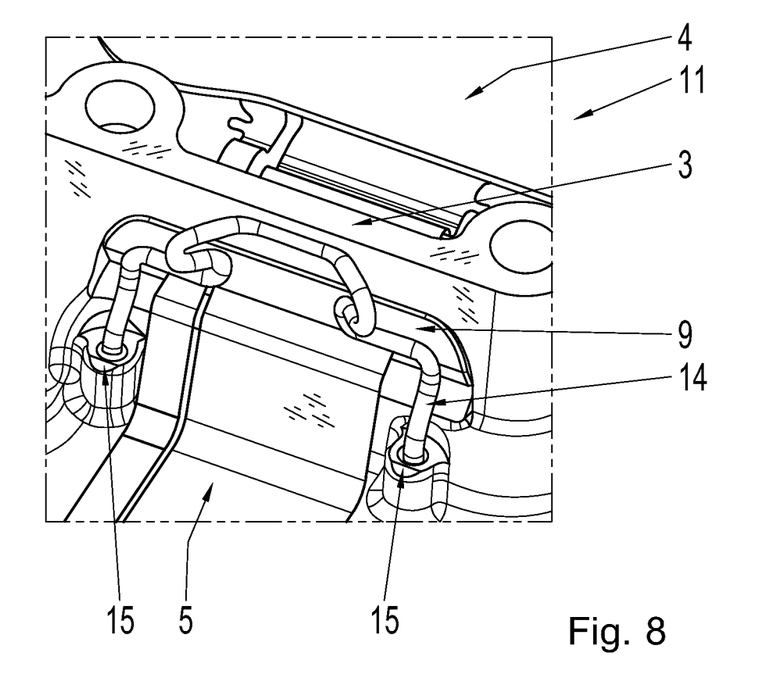
FIG. 8: a connection assembly with a further fixing element.

FIG. 8 shows an alternative embodiment of a connection assembly having a fixing element 14 configured as a retaining bracket. In this case, the fixing element 14 forms a separate component. By contrast to the fixing element 13 from FIG. 7, the fixing element 14 in FIG. 8 is designed in a wire-like manner. The fixing element 14 can be made of metal, for example spring steel. The fixing element 14 can thus consist of a wire, in particular a spring wire, bent into the suitable shape. Here, too, the fixing element 14 can be fastened in the housing by means of suitable retaining elements 15.

Alternatively, the fixing element 14 can be configured as a snap hook. This also makes it possible to secure the sheathing securely in the break-through.

Figure 9:
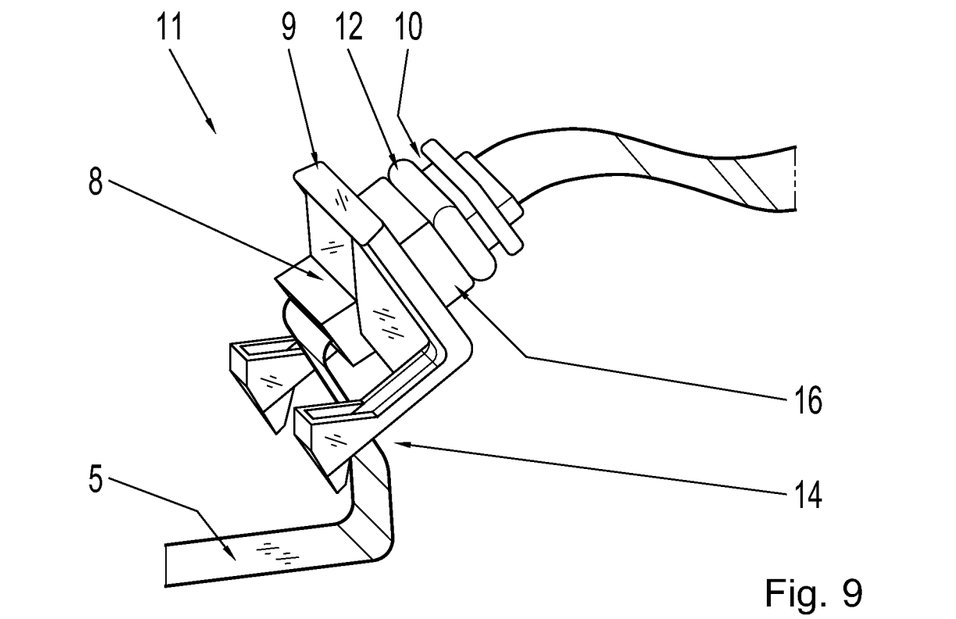
FIG. 9: parts of a connection assembly having a further fixing element.
Figure 10:
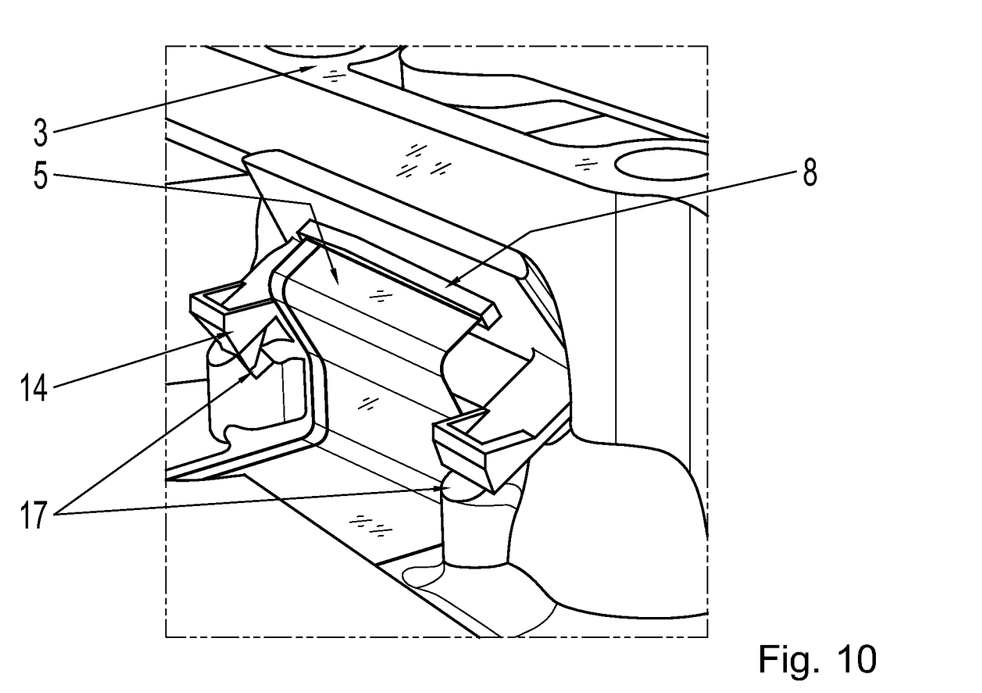
FIG. 10: a view of the connection assembly from FIG. 9 with a housing.

FIG. 9 and FIG. 10 show such a fixing element 14, which is configured as a snap hook. Here, the fixing element 14 is arranged directly on the stop element 9. As a result, the fixing element 14 can be formed together with the sheathing 8, or it can be formed together with an injection-molded attachment 16, which is applied to or on the sheathing 8.

Further details of the injection-molded attachment 16 are explained below with reference to FIG. 11.

With the embodiment of the fixing element 14 shown in FIGS. 9 and 10, the electrical line 5 can subsequently be fed through the stop element 9. The fixing element 14 consists of two arms, each of which is configured with a hook-shaped end. These arms protrude from the actual stop element 9 on both sides of the stop element 9. In the assembled state, these arms of the fixing element 14 engage into a respectively associated retaining element 17.

FIG. 10 shows the fixing element 14, which is configured as a snap hook, in the assembled state. The ends of the two arms of the fixing element 14 are each snapped into a suitable retaining element 17 (here, for example, a latching groove) on or in the region of the housing partition wall 3 on the side of the second housing chamber 2. Due to this snapping of the fixing element 14 into the retaining elements 17 and the resulting pressing of the stop element 9 against the housing partition wall 3, a secure and tight fastening of the sheathing in the break-through 7 can be achieved during the operation of the connection assembly.

Figure 11:
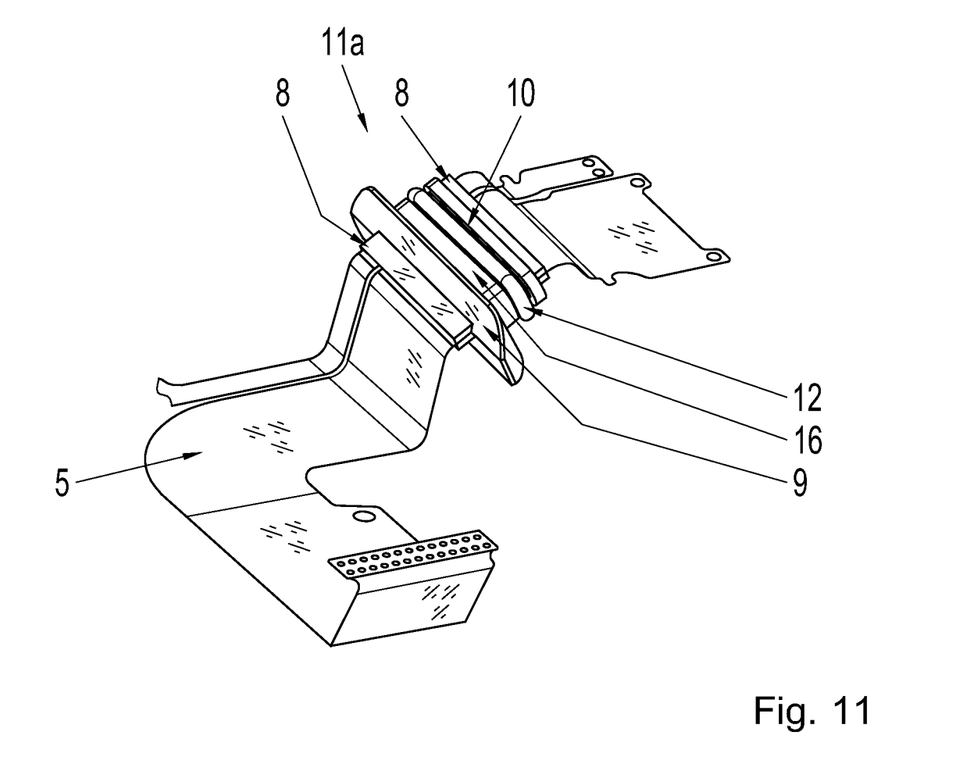
FIG. 11: a further embodiment of parts of a connection assembly.

FIG. 11 schematically shows parts of a further embodiment of a connection assembly 11a in a three-dimensional view. The connection assembly comprises the electrical line 5, which has the local sheathing 8 in the region of the break-through.

In order to achieve a connection of the sheathing 8 to the electrical line 5, this sheathing 8 can be made of a first plastic. This first plastic has a suitable first degree of hardness, such that a sufficiently tight and fixed connection between the sheathing 8 and the electrical line 5 is ensured. Such a first plastic can be a melt adhesive, for example. Such a plastic can be applied to the line 5 by means of a low-pressure method in order to form the sheathing 8.

In addition, the circumferential injection-molded attachment 16 is present at or on the sheathing 8. This is formed in particular by a further injection molding. This injection-molded attachment 16 consists in particular of a plastic having a second, higher degree of hardness than the sheathing 8. The injection-molded attachment 16 connects to the sheathing 8 as a further plastic. By applying a plastic with a higher degree of hardness, a permanent fixing in the break-through of the housing partition wall can be achieved. Slipping or falling away, for example the flowing away of the softer plastic due to extreme stress, can thus be permanently prevented.

Both the injection-molded attachment 16 and the sheathing 8 can be applied to the electrical line 5 by means of a post-overmolding.

The sheathing 8 is preferably applied using a low-pressure method. The injection-molded attachment 16 (post-injection molding) is then preferably applied with a high-pressure method. A simple assembly of the connection assembly 11a can be ensured by this post-injection molding.

In particular, the sheathing 8 is formed from a hot melt adhesive and the injection-molded attachment 16 is formed from a thermoplastic. Other suitable plastics can also be used.

The injection-molded attachment 16 can comprise the circumferential groove 10 in which the sealing ring 12 is arranged.

Furthermore, the stop element 9 is present, which is preferably formed integrally with the injection-molded attachment 16. The stop element 9 can then be produced together with the injection-molded attachment 16.

Furthermore, in the embodiment according to FIG. 11, the fixing element 13 or 14 described above can be used.

In all other respects, the explanations of the other embodiments according to FIG. 3 to FIG. 10 apply to FIG. 11.

LIST OF REFERENCE NUMERALS

101 First housing chamber
102 Second housing chamber
103 Housing partition wall
104 Circuit board
105 Flex film
106 Sensor terminal
107 Sealing frame
108 Protrusion
1 Housing chamber
2 Housing chamber
3 Housing partition wall
4 Electrical contact partner
5 Electrical line
6 Electrical contact partner
7 Break-through
8 Sheathing
9 Stop element
10 Groove
11 Connection assembly
11a Connection assembly
12 Sealing ring
13 Fixing element
14 Fixing element
15 Retaining element
16 Injection-molded attachment
17 Retaining element
D Insertion direction

The invention claimed is:

1. A connection assembly between two housing chambers of a control unit, the connection assembly comprising:
a housing defining a first housing chamber and a second housing chamber;
a housing partition wall arranged to separate the first housing chamber from the second housing chamber, the housing partition wall defining a break-through;
wherein the first housing chamber is configured as a dry chamber and comprises at least one first electrical contact partner;
wherein the second housing chamber is configured as a wet chamber and comprises at least one second electrical contact partner;
an electrical line electrically connecting the at least one first electrical contact partner to the at least one second electrical contact partner, wherein the electrical line is guided through the break-through, and wherein the electrical line comprises, locally in a region of the break-through, a single-layer or multi-layer sheathing configured for sealing the break-through; and
wherein the sheathing comprises a start and an end, wherein the start is formed in an insertion direction, wherein the insertion direction specifies the direction in which the electrical line is threaded through the break-through, and wherein, at the start or shortly after the start, the sheathing comprises a stop element, and wherein the stop element abuts the housing partition wall in the insertion direction.

2. The connection assembly according to claim 1, comprising:
a sealing ring arranged between the sheathing and the break-through, the sealing ring configured to provide a sealing effect between the break-through and the sheathing.

3. The connection assembly according to claim 2, wherein the sheathing comprises a circumferential groove, and wherein the sealing ring is arranged in the circumferential groove.

4. The connection assembly according to claim 1, comprising:
a fixing element arranged in front of the stop element, and causes a fixation of the stop element on the housing partition wall.

5. The connection assembly according to claim 4, comprising:
at least one retaining element on the housing partition wall, the at least one retaining element configured for fastening the fixing element.

6. The connection assembly according to claim 1, wherein the stop element and the sheathing comprise one piece.

7. The connection assembly according to claim 1, wherein the sheathing is made of plastic such that a fixed joining of the sheathing to the electrical line is brought about.

8. An electronics module for a vehicle, the electronics module comprising the connection assembly according to claim 1.

9. A connection assembly between two housing chambers of a control unit, the connection assembly comprising:
a housing defining a first housing chamber and a second housing chamber;
a housing partition wall arranged to separate the first housing chamber from the second housing chamber the housing partition wall defining a break-through;
wherein the first housing chamber is configured as a dry chamber and comprises at least one first electrical contact partner;
wherein the second housing chamber is configured as a wet chamber and comprises at least one second electrical contact partner;
an electrical line electrically connecting the at least one first electrical contact partner to the at least one second electrical contact partner, wherein the electrical line is guided through the break-through, and wherein the electrical line comprises, locally in the region of the break-through, a single-layer or multi-layer sheathing configured for sealing the break-through; and
an injection-molded attachment at least partially injected onto the sheathing such that the injection-molded attachment is fixedly connected to the sheathing.

10. The connection assembly according to claim 9, wherein the sheathing comprises a plastic having a first degree of hardness, and that the injection-molded attachment comprises a plastic having a second degree of hardness, wherein the second degree of hardness is higher than the first degree of hardness.

11. The connection assembly according to claim 9, wherein the sheathing comprises a start and an end, wherein the start is formed in the insertion direction, wherein the insertion direction specifies the direction in which the electrical line is threaded through the break-through, and wherein the injection-molded attachment comprises a stop element in a region of the start, and wherein the stop element abuts the housing partition wall in the insertion direction.

12. The connection assembly according to claim 9, comprising:
a sealing ring arranged between the injection-molded attachment and the break-through, and causes a sealing effect between the break-through and the injection-molded attachment.

* * * * *